(12) United States Patent
Redman-White et al.

(10) Patent No.: US 10,535,978 B2
(45) Date of Patent: Jan. 14, 2020

(54) METHOD FOR CONTROL OF OPTICAL INTENSITY AND EXTINCTION RATIO OF LASER MODULATION IN AN OPTICAL TRANSMITTER

(71) Applicant: Hilight Semiconductor Limited, Hampshire (GB)

(72) Inventors: William Redman-White, Alton Hants (GB); Dominique Coue, Hampshire (GB); Colin Whitfield, Hampshire (GB); Christian Rookes, Bristol (GB); Derek Hutchins, Hants (GB); George Brocklehurst, Ringwood (GB)

(73) Assignee: HILIGHT SEMICONDUCTOR LIMITED, Hampshire (GB)

( * ) Notice: Subject to any disclaimer, the term of this patent is extended or adjusted under 35 U.S.C. 154(b) by 3 days.

(21) Appl. No.: 15/883,443

(22) Filed: Jan. 30, 2018

(65) Prior Publication Data

US 2018/0219354 A1 Aug. 2, 2018

(30) Foreign Application Priority Data

Feb. 1, 2017 (GB) .................................. 1701656.9
Feb. 1, 2017 (GB) .................................. 1701657.7

(51) Int. Cl.
*H01S 5/0683* (2006.01)
*H04B 10/50* (2013.01)
*H01S 5/042* (2006.01)

(52) U.S. Cl.
CPC ......... *H01S 5/0683* (2013.01); *H04B 10/505* (2013.01); *H04B 10/50572* (2013.01);
(Continued)

(58) Field of Classification Search
CPC .... H01S 5/0683; H01S 5/042; H01S 5/06832; H04B 10/505; H04B 10/50572; H04B 10/50575
See application file for complete search history.

(56) References Cited

U.S. PATENT DOCUMENTS 6,822,987 B2 * 11/2004 Diaz ...................... H01S 5/042
372/38.01
7,142,574 B2 * 11/2006 Asuri .................. H01S 5/06832
372/38.02
(Continued)

OTHER PUBLICATIONS

Feth, Lawrence L., "Instrumentation & Techniques, A Pseudorandom Noise Generator for Use in Auditory Research," Behavioural Research Methods and Instrumentation, 1970, vol. 2(4), pp. 169-171.
(Continued)

*Primary Examiner* — Yuanda Zhang
(74) *Attorney, Agent, or Firm* — Squire Patton Boggs (US) LLP

(57) ABSTRACT

A system for controlling an optical intensity and modulation of an optical data transmitter which includes current driver circuitry configured to provide a drive current to a laser diode wherein said current comprises a fixed component and a modulated component, said modulated component having a magnitude related to an input data stream. The monitor circuitry contains a photodiode and a first transimpedance amplifier coupled to said photodiode, said monitor circuitry configured to provide an output signal related to an optical intensity of said laser diode. The system further includes replica monitor circuitry containing a replica capacitor with a replica capacitance and a second transimpedance amplifier configured to be substantially identical in construction to said first transimpedance amplifier, said second transimpedance amplifier coupled to said replica capacitor. The system
(Continued)

further includes replica capacitance control circuitry configured to control said replica capacitance of said replica capacitor to match a capacitance associated with said photodiode.

20 Claims, 10 Drawing Sheets

(52) U.S. Cl.
CPC ........ *H04B 10/50575* (2013.01); *H01S 5/042* (2013.01); *H01S 5/06832* (2013.01)

(56) References Cited

U.S. PATENT DOCUMENTS

| | | | | |
|---|---|---|---|---|
| 2012/0106953 | A1* | 5/2012 | Nguyen | H01S 5/0683 398/38 |
| 2014/0186056 | A1* | 7/2014 | Nuttgens | H04B 10/50572 398/197 |
| 2017/0288369 | A1* | 10/2017 | Ikram | H04B 10/50593 |

OTHER PUBLICATIONS

Smith, David W., "Laser level-control circuit for high-bit-rate systems using a slope detector," Electronics Letters, vol. 14, No. 24, Nov. 23, 1978, pp. 775-776.

Wonham, W.M., et al., "Probability Densities of the Smoothed 'Random Telegraph Signal'", Journal of Electronics and Control, vol. 4, 1958, Issue 6, pp. 567-576.

\* cited by examiner

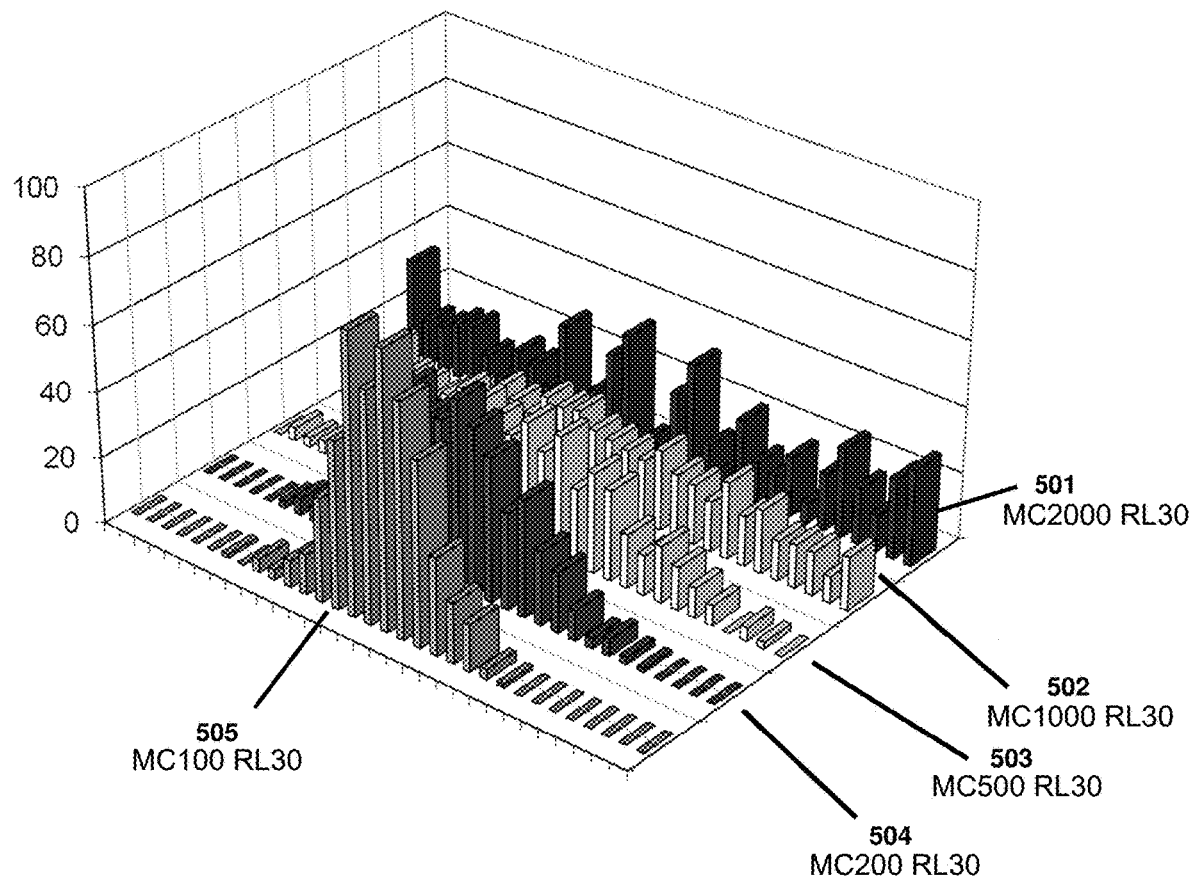
Figure 5 PDF in 32 normalised bins of 10Gb/s random data Run length 30 bits
Monitor BW 2GHz – 100MHz Figure 6A PDF in 32 normalised bins of 10Gb/s random data Monitor BW 680MHz Run length 30 bits vs ideal Gaussian. Sigma ~8, mean =15.5
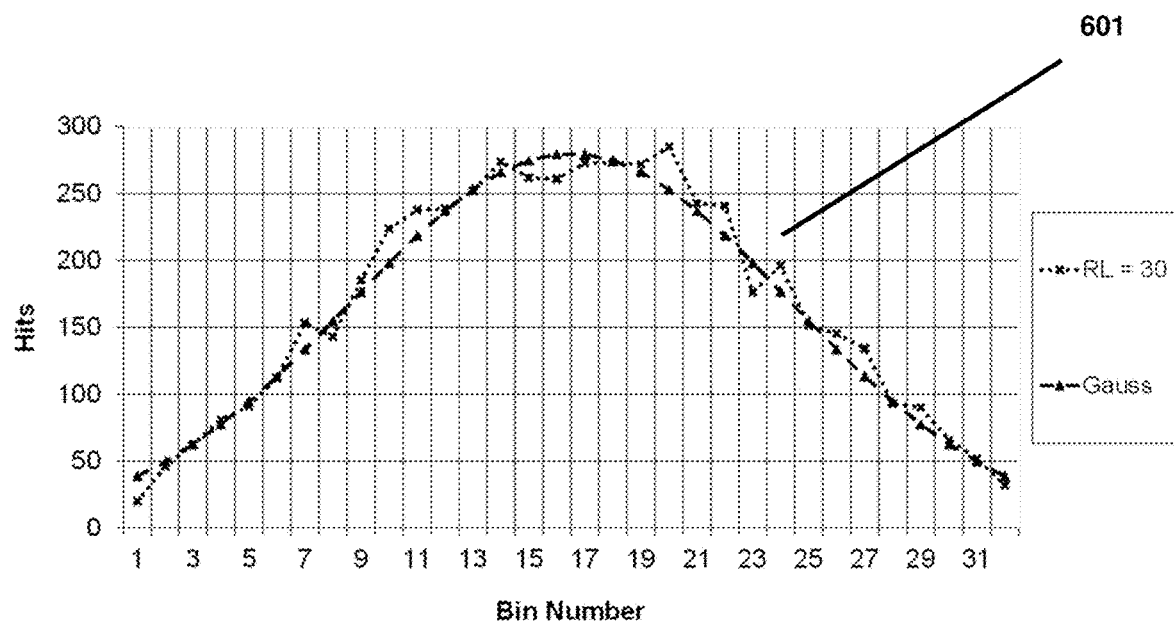
Figure 6B PDF in 32 normalised bins of 10Gb/s random data Monitor BW 220MHz. Run length 30 bits vs ideal Gaussian. Sigma ~4.2, mean =15.5
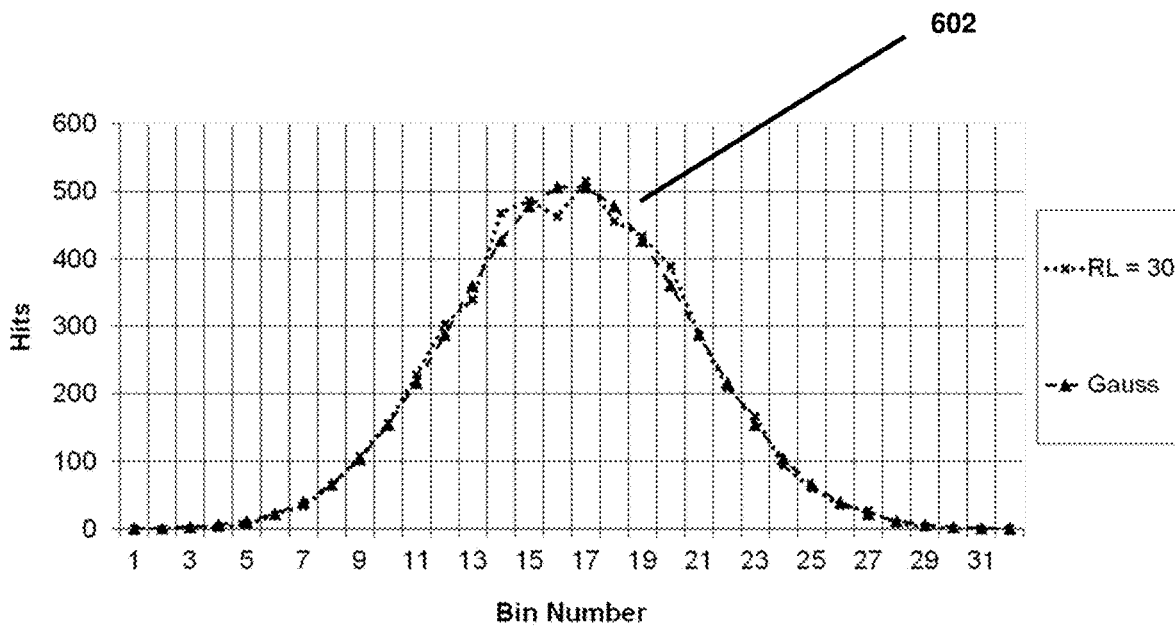

METHOD FOR CONTROL OF OPTICAL INTENSITY AND EXTINCTION RATIO OF LASER MODULATION IN AN OPTICAL TRANSMITTER

BACKGROUND OF THE INVENTION

In a fibre optical communications system it is desirable to be able to control the modulation depth of the light generated by the transmitting laser device. In order to maintain fast switching between states and reduce noise, the transmitting laser is not switched to some defined power and then switched off, but for the low state its output is reduced to a low level. This modulation depth is also described as an extinction ratio (ER), the latter being the ratio of the optical intensity when there is a data '1' and the intensity when there is a data '0'. The current required by the laser to deliver these high and low optical outputs is not however constant and indeed is affected by the tolerances between individual laser devices, and also over time, due to the variation of a single laser device's characteristics due to heating and ageing. Such variations can occur in normal operation as a device heats up in use.

Hence it is desired not only to be able to compensate automatically for manufacturing tolerances and parameter drift in the laser itself, but also to be able to reach some defined target modulation level where the data pattern has a random characteristic with only limited low frequency content.

There are several methods for controlling the modulation (or ER) are described in prior art. Usually these make assumptions about characteristics of the devices or data patterns that may not always be valid. Many methods are related to a technique presented by Smith (Electronics Letters, October 1978 pp 775-776), wherein a low amplitude low frequency (LF) modulation is added to the normal laser current. The fluctuations in the optical output from the laser at the known LF modulation frequency permit the estimation of the zero and/or average optical levels, and hence the slope of the laser current/optical output characteristic can be calculated. Because this modulation is relatively low frequency, the system provided to monitor the optical output power does not have to have a high bandwidth, which is an attractive feature. Provided that the laser characteristic does not have excessive non-linearity, it is thus possible to construct a feedback loop to maintain reasonable control over the modulation depth (or ER) provided that the feedback loop implied in this system has time to settle, as in the case of continuous mode operation. The main limitation with such systems is that there is an implied assumption that the laser's current vs optical output characteristic is substantially linear. At higher operating power levels this is not a safe assumption.

A more direct approach is to attempt to measure the optical output levels that directly correspond to logical 1 and logical 0 states. There is normally provided a photodiode to sense the optical output power from the laser, together with an associated monitor transimpedance amplifier, together hereinafter referred to as a monitor channel. The performance of this latter function places restrictions on the operation of any such control loop, since for cost and power reasons, the bandwidth of any monitor channel used to control the system is frequently much less than that of the main communication channel.

The transmitted optical data will switch between its logical 1 and logical 0 levels at rates defined by system level requirements, and will remain substantially constant at these levels for the duration of the number of consecutive symbols of the same sign. This consecutive number is referred to as the run length. In many practical systems, the monitor channel bandwidth is sufficiently restricted as to cause its own output to settle only if the observed optical signal is constant for a relatively large number of symbols. Given that in a random data stream the probability of a given run length decreases as the length increases, it is clear that a monitor channel of restricted bandwidth will give only very infrequent outputs corresponding directly to the optical 1 and optical 0 levels.

In some prior art, attempts are made to achieve an accurate estimation of the logical 1 and 0 levels by gating the output of the monitor channel such that its value is only considered when a long run length is detected in the incoming data stream and hence the value observed via the monitor channel will have had time to settle. This approach has some merit, but it still places significant demands on the bandwidth of the monitor channel as a ratio of the symbol rate, with attendant increased power consumption likely in the monitor channel.

Hence some other methods are sought by which the optical 1 and 0 levels can be estimated or inferred from the outputs of a monitor channel having restricted bandwidth compared with the symbol rate.

Rather than consider the direct time-domain output from the monitor channel, one may instead look at the statistics of the monitor signal, and in particular at the probability density function (PDF) of this output. Consider the situation if the monitor channel were to have unlimited bandwidth. Since the optical output has a defined time to change between levels, and then remains at each level for the run length at some instant, it will be apparent that the PDF will have a bi-modal form, with a near constant level between the two peaks. For a random data signal, the relative magnitudes of the peaks at each end of the PDF and the level in between will vary with the maximum run length used. As the bandwidth of the monitor channel is reduced below approximately 10% of the symbol rate, the bimodal form is lost and becomes more Gaussian, and the values corresponding to the ideal logical 1 and logical 0 are not very evident in the PDF.

If the bandwidth is reduced still further below approximately 5% of the symbol rate, the tails of the Gaussian form of the PDF drop to near zero at the expected logical 1 and 0 values. However, the mean and standard deviation values do not depend strongly on the maximum run length of the data stream. The main determining factors for the standard deviation (relative to the mean value) are the ER of the optical signal and the bandwidth of the monitor channel. Hence if the bandwidth of the monitor channel can be accounted for in the measurement system, the standard deviation of the monitor output may be used to infer the ER.

Measuring the bandwidth of the monitor channel directly is possible but not very convenient in a complete optical system as it depends on the capacitance of the photodiode used for the monitor function. It is also necessary to have knowledge of the absolute gain through the monitor channel so that the standard deviation observed can be appropriately scaled. An alternative and more practical method is to use a parallel replica signal path, whereby the effects of the gain and bandwidth on ideal data may be taken into account.

SUMMARY OF THE INVENTION

According to a first aspect there is provided a system for controlling an optical intensity and modulation of an optical data transmitter comprising: current driver circuitry configured to provide a drive current to a laser diode wherein said current comprises a fixed component and a modulated component, said modulated component having a magnitude related to an input data stream; monitor circuitry, comprising a photodiode and a first transimpedance amplifier coupled to said photodiode, said monitor circuitry configured to provide an output signal related to an optical intensity of said laser diode; replica monitor circuitry comprising a replica capacitor with a replica capacitance and a second transimpedance amplifier configured to be substantially identical in construction to said first transimpedance amplifier, said second transimpedance amplifier coupled to said replica capacitor; and replica capacitance control circuitry configured to control said replica capacitance of said replica capacitor to match a capacitance associated with said photodiode.

Said replica capacitance control circuitry may be configured to control said replica capacitance of said replica capacitor such that a bandwidth of said second transimpedance amplifier is configured to be substantially identical to a bandwidth of said first transimpedance amplifier.

Said replica capacitance control circuitry may comprise: an oscillator configured to generate a frequency output signal; a switch configured to couple said oscillator to one of said photodiode and said replica capacitor, wherein said oscillator may be configured to generate said frequency output signal at a frequency determined by a value of a capacitance coupled to said oscillator by said switch.

The system may further comprise frequency determining circuitry for determining a frequency of said frequency output signal.

Said frequency determining circuitry may further comprise a counter configured to determine said frequency of said frequency output signal.

The system may further comprise a comparator configured to compare a frequency of said frequency output signal when said switch couples said oscillator to one of said photodiode and said replica capacitor.

Said replica capacitance control circuitry may be configured to receive an output from said frequency determining circuitry and control said capacitance of said replica capacitor.

Said replica capacitor may comprise a plurality of switchable capacitors arranged electrically in parallel, and wherein said replica capacitance control circuitry is configured to control switching of said plurality of switchable capacitors to match said capacitance associated with said photodiode.

According to a second aspect there is provided a method for controlling an optical intensity and modulation of an optical data transmitter, the method comprising: providing a drive current to a laser diode wherein said current comprises a fixed component and a modulated component, said modulated component having a magnitude related to an input data stream; providing an output signal related to an optical intensity of said laser diode using a photodiode and a first transimpedance amplifier coupled to said photodiode; providing a replica capacitor with a replica capacitance and a second transimpedance amplifier configured to be substantially identical in construction to said first transimpedance amplifier, said second transimpedance amplifier coupled to said replica capacitor; and controlling said replica capacitance of said replica capacitor to match a capacitance associated with said photodiode.

Controlling said replica capacitance may comprise controlling said replica capacitance of said replica capacitor such that a bandwidth of said second transimpedance amplifier is configured to be substantially identical to a bandwidth of said first transimpedance amplifier.

Controlling said replica capacitance may comprise: generating, using an oscillator, a frequency output signal; selectively coupling said oscillator to one of said photodiode and said replica capacitor, wherein said oscillator is configured to generate said frequency output signal at a frequency determined by a value of a capacitance coupled to said oscillator.

The method may further comprise determining a frequency of said frequency output signal.

Determining a frequency of said frequency output signal may further comprise determining said frequency of said frequency output signal using a counter.

The method may further comprise comparing said frequency of said frequency output signal when coupling said oscillator to one of said photodiode and said replica capacitor.

Controlling said replica capacitance of said replica capacitor may comprise: receiving said frequency of said frequency output signal; and controlling said capacitance of said replica capacitor dependent on said frequency of said frequency output signal.

Controlling said replica capacitance of said replica capacitor may comprise controlling switching a plurality of switchable capacitors arranged electrically in parallel to match said capacitance associated with said photodiode.

According to a third aspect there is provided an apparatus for controlling an optical intensity and modulation of an optical data transmitter comprising: means for providing a drive current to a laser diode wherein said current comprises a fixed component and a modulated component, said modulated component having a magnitude related to an input data stream;

means for monitoring, comprising a photodiode and a first transimpedance amplifier coupled to said photodiode, said means for monitoring configured to provide an output signal related to an optical intensity of said laser diode; means for replicating said means for monitoring comprising a replica capacitor with a replica capacitance and a second transimpedance amplifier configured to be substantially identical in construction to said first transimpedance amplifier, said second transimpedance amplifier coupled to said replica capacitor; and means for controlling said replica capacitance of said replica capacitor to match a capacitance associated with said photodiode.

Said means for controlling said replica capacitance may be configured to control said replica capacitance of said replica capacitor such that a bandwidth of said second transimpedance amplifier is configured to be substantially identical to a bandwidth of said first transimpedance amplifier.

Said means for controlling said replica capacitance may comprise: an oscillator configured to generate a frequency output signal; a switch configured to couple said oscillator to one of said photodiode and said replica capacitor, wherein said oscillator is configured to generate said frequency output signal at a frequency determined by a value of a capacitance coupled to said oscillator by said switch.

The apparatus may further comprise means for determining a frequency of said frequency output signal.

Said means for determining a frequency of said frequency output signal may further comprises means for counting said frequency of said frequency output signal.

The apparatus may further comprise means for comparing a frequency of said frequency output signal when said switch couples said oscillator to one of said photodiode and said replica capacitor.

Said means for controlling said replica capacitance may comprise means for receiving an output from said means for determining a frequency of said frequency output signal and means for controlling said capacitance of said replica capacitor based on said output.

Said replica capacitor may comprise a plurality of switchable capacitors arranged electrically in parallel, and wherein said means for controlling said replica capacitance may comprise means for controlling switching of said plurality of switchable capacitors to match said capacitance associated with said photodiode.

According to a fourth aspect there is provided a system for controlling the optical intensity and modulation of an optical data transmitter comprising: current driver circuitry configured to provide a drive current to a laser diode wherein said current comprises a fixed component and a modulated component, said modulated component having a magnitude related to an input data stream, and; monitor circuitry, said monitor circuitry comprising: a photodiode; and a first transimpedance amplifier coupled to said photodiode, wherein said monitor circuitry is configured to provide an output signal related to an optical intensity of said laser diode; replica monitor circuitry, said replica monitor circuitry comprising: a second transimpedance amplifier, said second transimpedance amplifier configured to be substantially identical in construction to said first transimpedance amplifier; and replica control circuitry configured to control a gain and a bandwidth of said second transimpedance amplifier to be substantially identical to said first transimpedance amplifier; a current source configured to provide a fixed current and a modulated current to an input of said second transimpedance amplifier, said modulated current having a magnitude related to said input data stream; and current driver control circuitry configured to determine a mean and a standard deviation of outputs of said first and second transimpedance amplifiers, and generate at least one control signal to control said current driver circuitry to control an average and a modulation depth of the optical intensity of said laser diode based on said mean and said standard deviation of said outputs of said first and second transimpedance amplifiers.

Said current driver control circuitry may comprise: a first low pass filter coupled to receive an output of said first transimpedance amplifier and configured to generate a first mean output related to said mean of said output of said first transimpedance amplifier.

Said current driver control circuitry may comprise: a second low pass filter coupled to receive an output of said second transimpedance amplifier and configured to generate a second mean output related to said mean of said output of said second transimpedance amplifier.

Said current driver control circuitry may further comprise: a first high pass filter coupled to receive said output of said first transimpedance amplifier; a first root-mean-square (RMS) detector coupled to receive an output of said first high pass filter; and a first RMS low pass filter coupled to receive an output of said first RMS detector and configured to generate an output related to the standard deviation of said output of said first transimpedance amplifier.

Said current driver control circuitry may further comprise: a second high pass filter coupled to receive said output of said second transimpedance amplifier; a second root-mean-square (RMS) detector coupled to receive an output of said second high pass filter; and a second RMS low pass filter coupled to receive an output of said second RMS detector and configured to generate an output related to the standard deviation of said output of said second transimpedance amplifier.

Said current driver control circuitry may further comprise: first comparator circuitry configured to compare said mean output of said output of said first transimpedance amplifier with said mean output of said output of said second transimpedance amplifier.

Said current driver control circuitry may further comprise: second comparator circuitry configured to compare said standard deviation output of said output of said first transimpedance amplifier with said standard deviation output of said output of said second transimpedance amplifier.

Said current driver control circuitry may further comprise a signal generator configured to generate at least one bias and modulation current driver control signal based on said first comparator circuitry and said second comparator circuitry, said at least one bias and modulation current driver control signal configured to control said average optical intensity and to control said modulation depth of said laser diode.

Said replica control circuitry may be configured to control said bandwidth of said second transimpedance amplifier by altering a value of a capacitance connected to said input of said second transimpedance amplifier.

The system may further comprise an oscillator circuit configured to generate a frequency output signal, wherein said frequency output is used to compare said capacitance connected to said input of said second transimpedance amplifier with a capacitance connected to an input of said first transimpedance amplifier.

Said replica control circuitry may comprise a capacitor controller configured to receive said frequency output signal of said oscillator and adjust said capacitance connected to said second transimpedance amplifier such that it becomes substantially identical to said capacitance associated with said first transimpedance amplifier.

According to a fifth aspect there is provided a method for controlling the optical intensity and modulation of an optical data transmitter, the method comprising: providing a drive current to a laser diode wherein said current comprises a fixed component and a modulated component, said modulated component having a magnitude related to an input data stream, and; monitoring using monitor circuitry to provide an output signal related to an optical intensity of said laser diode, said monitor circuitry comprising: a photodiode; and a first transimpedance amplifier coupled to said photodiode; replicating said monitoring circuitry, using replica monitor circuitry, said replica monitor circuitry comprising: a second transimpedance amplifier, said second transimpedance amplifier configured to be substantially identical in construction to said first transimpedance amplifier; and replica control circuitry configured to control a gain and a bandwidth of said second transimpedance amplifier to be substantially identical to said first transimpedance amplifier; providing a fixed current and a modulated current to an input of said second transimpedance amplifier using a current source, said modulated current having a magnitude related to said input data stream; determining a mean and a standard deviation of outputs of the first and second transimpedance amplifiers; and generating at least one control signal to control said current driver circuitry to control an average and modulation depth of the optical intensity of said laser diode based on said mean and said standard deviation of the outputs of said first and second transimpedance amplifiers.

Said determining a mean and a standard deviation of outputs of the first and second transimpedance amplifiers may comprise: coupling a first low pass filter to receive an output of said first transimpedance amplifier and generating a first mean output related to said mean of said output of said first transimpedance amplifier.

Said determining a mean and a standard deviation of outputs of the first and second transimpedance amplifiers may comprise: coupling a second low pass filter to receive an output of said second transimpedance amplifier and generating a second mean output related to said mean of said output of said second transimpedance amplifier.

Determining a mean and a standard deviation of outputs of the first and second transimpedance amplifiers may further comprise: coupling a first high pass filter to receive said output of said first transimpedance amplifier; coupling a first root-mean-square (RMS) detector to receive an output of said first high pass filter; coupling a first RMS low pass filter to receive an output of said first RMS detector; and generating an output related to the standard deviation of said output of said first transimpedance amplifier.

Determining a mean and a standard deviation of outputs of the first and second transimpedance amplifiers may comprise: coupling a second high pass filter to receive said output of said second transimpedance amplifier; coupling a second root-mean-square (RMS) detector to receive an output of said second high pass filter; coupling a second RMS low pass filter to receive an output of said second RMS detector; and generating an output related to the standard deviation of said output of said second transimpedance amplifier.

Generating at least one control signal to control said current driver circuitry to control an average and modulation depth of the optical intensity of said laser diode based on said mean and said standard deviation of the outputs of said first and second transimpedance amplifiers further may comprise: comparing said mean output of said output of said first transimpedance amplifier with said mean output of said output of said second transimpedance amplifier.

Generating at least one control signal to control said current driver circuitry to control an average and modulation depth of the optical intensity of said laser diode based on said mean and said standard deviation of the outputs of said first and second transimpedance amplifiers may further comprise: comparing said standard deviation output of said output of said first transimpedance amplifier with said standard deviation output of said output of said second transimpedance amplifier.

Generating at least one control signal to control said current driver circuitry to control an average and modulation depth of the optical intensity of said laser diode based on said mean and said standard deviation of the outputs of said first and second transimpedance amplifiers may further comprise generating at least one bias and modulation current driver control signal based on said first comparator circuitry and said second comparator circuitry, said at least one bias and modulation current driver control signal configured to control said average optical intensity and to control said modulation depth of said laser diode.

Controlling said bandwidth of said second transimpedance amplifier may comprise altering a value of a capacitance connected to said input of said second transimpedance amplifier.

The method may further comprise generating a frequency output signal, wherein said frequency output signal is used to compare said capacitance connected to said input of said second transimpedance amplifier with a capacitance connected to an input of said first transimpedance amplifier.

Controlling a gain and a bandwidth of said second transimpedance amplifier to be substantially identical to said first transimpedance amplifier may comprise: receiving said frequency output signal of said oscillator; and adjusting said capacitance connected to said second transimpedance amplifier such that it becomes substantially identical to said capacitance associated with said first transimpedance amplifier.

According to a sixth aspect there is provided an apparatus for controlling the optical intensity and modulation of an optical data transmitter, said apparatus comprising: means for providing a drive current to a laser diode wherein said current comprises a fixed component and a modulated component, said modulated component having a magnitude related to an input data stream, and; means for monitoring using monitor circuitry to provide an output signal related to an optical intensity of said laser diode, said monitor circuitry comprising: a photodiode; and a first transimpedance amplifier coupled to said photodiode; means for replicating said monitoring circuitry, using replica monitor circuitry, said replica monitor circuitry comprising: a second transimpedance amplifier, said second transimpedance amplifier configured to be substantially identical in construction to said first transimpedance amplifier; and replica control circuitry configured to control a gain and a bandwidth of said second transimpedance amplifier to be substantially identical to said first transimpedance amplifier; means for providing a fixed current and a modulated current to an input of said second transimpedance amplifier using a current source, said modulated current having a magnitude related to said input data stream; means for determining a mean and a standard deviation of outputs of the first and second transimpedance amplifiers; and means for generating at least one control signal to control said current driver circuitry to control an average and modulation depth of the optical intensity of said laser diode based on said mean and said standard deviation of the outputs of said first and second transimpedance amplifiers.

Said means for determining a mean and a standard deviation of outputs of the first and second transimpedance amplifiers may comprise: first means for low pass filtering an output of said first transimpedance amplifier and generating a first mean output related to said mean of said output of said first transimpedance amplifier.

Said means for determining a mean and a standard deviation of outputs of the first and second transimpedance amplifiers may comprise: second means for low pass filtering an output of said second transimpedance amplifier and generating a second mean output related to said mean of said output of said second transimpedance amplifier.

Said means for determining a mean and a standard deviation of outputs of the first and second transimpedance amplifiers may comprise: first means for high pass filtering said output of said first transimpedance amplifier; first means for root-mean-square (RMS) detecting an output of said first means for high pass filtering; first RMS means for low pass filtering an output of said first means for RMS detecting and generating an output related to the standard deviation of said output of said first transimpedance amplifier.

Said means for determining a mean and a standard deviation of outputs of the first and second transimpedance amplifiers may comprise: second means for high pass filtering said output of said second transimpedance amplifier; second means for root-mean-square (RMS) detecting an output of said means for second high pass filtering; second RMS means for low pass filtering to receive an output of said second means for RMS detecting and generating an output related to the standard deviation of said output of said second transimpedance amplifier.

Said means for generating at least one control signal to control said current driver circuitry to control an average and modulation depth of the optical intensity of said laser diode based on said mean and said standard deviation of the outputs of said first and second transimpedance amplifiers may further comprise: means for comparing said mean output of said output of said first transimpedance amplifier with said mean output of said output of said second transimpedance amplifier.

Said means for generating at least one control signal to control said current driver circuitry to control an average and modulation depth of the optical intensity of said laser diode based on said mean and said standard deviation of the outputs of said first and second transimpedance amplifiers may further comprise: means for comparing said standard deviation output of said output of said first transimpedance amplifier with said standard deviation output of said output of said second transimpedance amplifier.

Said means for generating at least one control signal to control said current driver circuitry to control an average and modulation depth of the optical intensity of said laser diode based on said mean and said standard deviation of the outputs of said first and second transimpedance amplifiers may further comprise means for generating at least one bias and modulation current driver control signal based on said first comparator circuitry and said second comparator circuitry, said at least one bias and modulation current driver control signal configured to control said average optical intensity and to control said modulation depth of said laser diode.

Said means for controlling said bandwidth of said second transimpedance amplifier may comprise means for altering a value of a capacitance connected to said input of said second transimpedance amplifier.

The apparatus may further comprise means for generating a frequency output signal, wherein said frequency output signal is used to compare said capacitance connected to said input of said second transimpedance amplifier with a capacitance connected to an input of said first transimpedance amplifier.

Said means for controlling a gain and a bandwidth of said second transimpedance amplifier to be substantially identical to said first transimpedance amplifier may comprise: means for receiving said frequency output signal of said oscillator; and means for adjusting said capacitance connected to said second transimpedance amplifier such that it becomes substantially identical to said capacitance associated with said first transimpedance amplifier.

BRIEF DESCRIPTION OF THE DRAWINGS

Some embodiments will now be described solely by way of example and with reference to the accompanying drawings in which:

FIG. 5 shows changes in the form of the PDF of a non-return-to-zero (NRZ) signal observed with different bandwidth restrictions.

FIGS. 6A and 6B show the PDF of a simulated NRZ optical signal observed within limited BW examples.

DETAILED DESCRIPTION

The description of the embodiments is not to be taken in a limiting sense but is made merely for the purposes of describing the general principles of the embodiments of the invention. For example, operations that are illustrated as being performed using digital signals and digital circuits may also be achieved using substantially analogue signals and analogue circuits.

Figure 1:
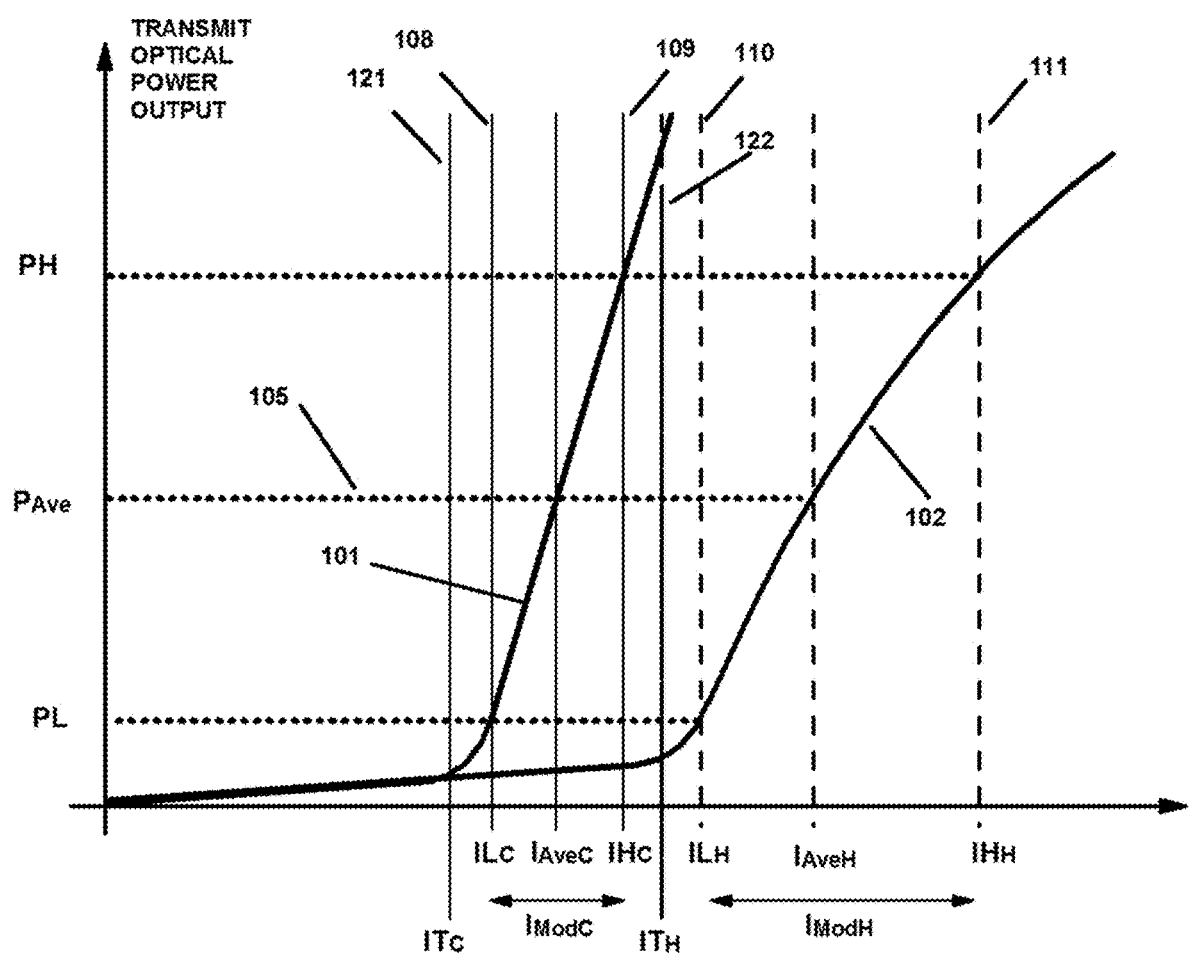
FIG. 1 shows typical laser characteristics vs temperature.

FIG. 1 is a diagrammatic representation of the characteristics of a typical laser diode as is used in optical communications systems. When used to generate a modulated optical signal, the current through the laser diode is modulated such that the minimum current 108 is above the threshold value 121 for the laser, and the maximum current 109 is below the manufacturer's ratings for the device. When a laser diode is cold, or the current levels are relatively low, a simple linear model 101 may suffice. However, when the laser diode heats up, or as its characteristics change with age, the threshold current may change 122 and the relationship may exhibit a more curved shape 102. Thus, the minimum current 110 and the maximum current 111 should both be increased in such a way as to maintain the desired average optical output 105 and the desired ER during operation. Maintaining such control over a system's lifetime is not a trivial task.

In any given practical system, the maximum current may be set so that the average operating power of the laser is set to a defined level with regard to the required signal level for reliable communications to be established. A critical parameter in such a system is the ratio of the maximum to minimum optical output, usually referred to as the Extinction Ratio (ER), as this affects the signal to noise levels for the receiver. The ER is a function of the minimum and maximum laser diode current values, and is sometimes represented as a simple linear relationship, but in reality this is not an accurate representation.

Figure 2:
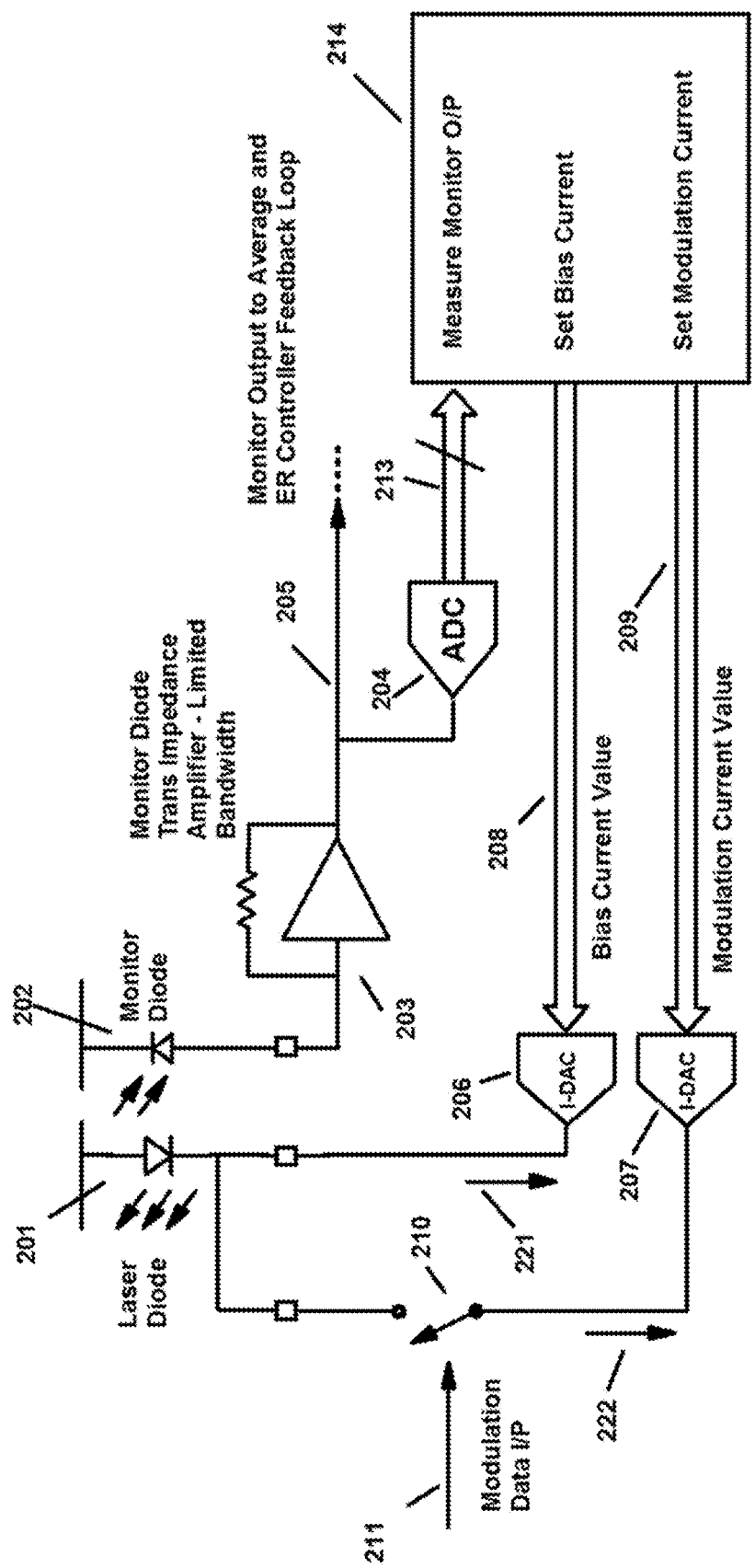
FIG. 2 shows an exemplar optical transmitter and monitor channel architecture.

FIG. 2 shows the typical arrangement in a transmitter suitable for an optical communications system. A laser diode 201 is provided with a current having a steady element and a variable element. This may be in the form of an average current with a bi-directional modulation current adding and subtracting current to create the optical maxima and minima; alternatively there may be a smaller steady bias current 221 with a modulation current 222 that is disconnected by means of a switching function 210 to indicate a logical low level in the modulation data input 211, or connected by said switching function 210 to add to said current 221 to indicate a logical high value. The latter variant is represented in FIG. 2. These currents 221 and 222 may be provided by digital-to-analogue converters 206 and 207 respectively having current outputs controlled by digital values 208 and 209 respectively that are set by the controller function 214.

The optical output of the laser diode 201 is sensed by a monitor photodiode 202 to create a current proportional to the sensed optical level and which may be converted to a voltage 205 with a trans-impedance amplifier 203. The combination of the monitor diode 202 and amplifier 203 typically have a bandwidth that is substantially less than that of the main data channel bandwidth. This monitor value 205 may be converted to digital form 213 by means of an analogue-to-digital converter 204 and these data may be used by the controller 214 to set the laser diode current levels (in this example 221 and 222) according to some mechanism. The bandwidth limitation of the monitor channel is very significant in the implementation of any transmit optical level control mechanism since it restricts the observability of the peak and trough values of the optical signal.

Figure 3:
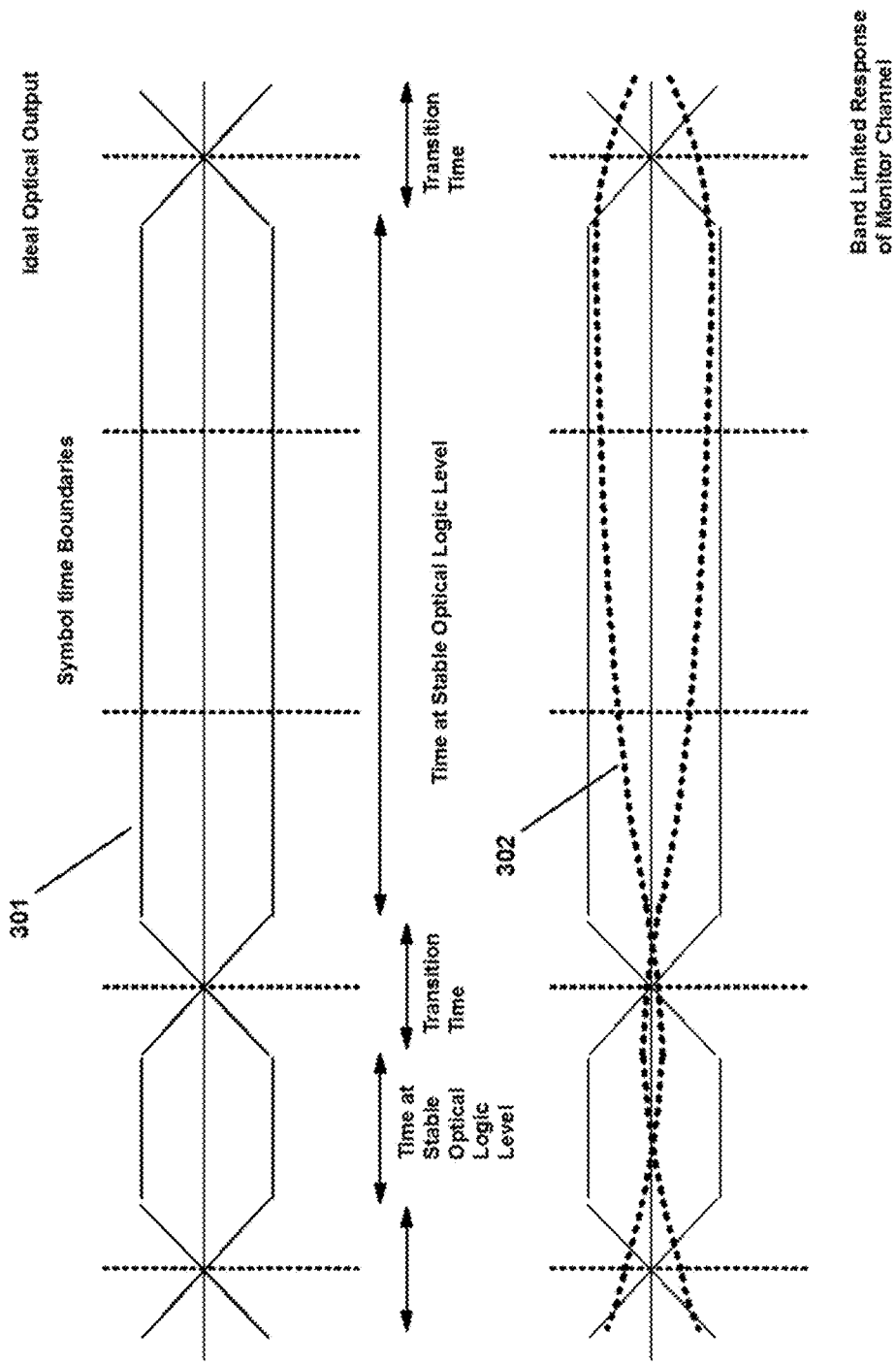
FIG. 3 shows idealised and band-limited optical waveforms and eye diagrams.

FIG. 3 depicts idealised waveforms representing the transmitted optical signal levels and the corresponding outputs from the monitor channel. The upper trace 301 represents typical ideal transmitted optical intensity levels. There are defined maximum and minimum levels that correspond to logical 1 and 0 values, and when the transmitted data have a number of consecutive identical values, the optical levels remain constant. When there is transition to the opposite value, this takes place with an approximately linear ramp and within a defined time interval, typically of the order of half of a unit symbol duration. If the monitor channel were to have a bandwidth larger than the data symbol rate, then the output of the monitor would be very similar to this ideal waveform.

In the lower trace 302 there is an idealised representation of the response through a monitor channel whose bandwidth is significantly less than the symbol rate. The peak-to-peak (pk-pk) values of the monitor output are a strong function of the number of consecutive symbols of the same value (known as the run length), and the monitor output may only reach the ideal peak value when there is a very long run of identical symbols, which in a substantially random data stream is unlikely. Further, zero crossing instants are displaced in a similar manner.

Figure 4:
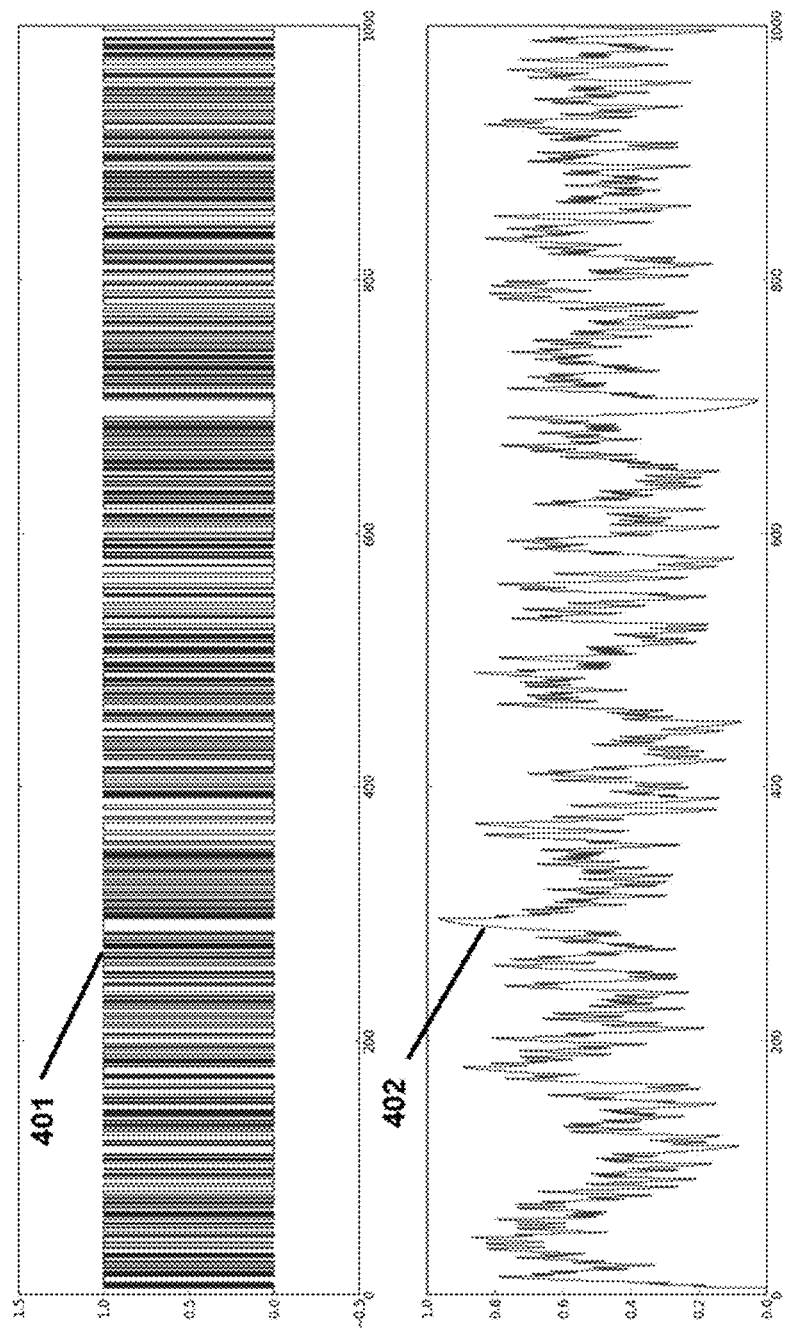
FIG. 4 shows simulation of ideal and band-limited optical waveforms.

FIG. 4 shows a simulation of the effect of a restricted monitor channel bandwidth. The upper trace 401 is a stream of random binary data formatted as an idealised non-return-to-zero (NRZ) signal as is commonly used in optical communication systems. The speed of the transition between the 1 and 0 states and vice versa is set to a typical value, in this example 50% of the unit symbol time period. The lower trace 402 shows the effect of passing this signal through a first-order low pass response whose bandwidth is 4% of the symbol rate, a reasonable figure for a practical optical receiver system of this type. The reduction in the pk-pk value is evident, and the variation in the short-range average shows dependence on the data content. It is also evident that neither observation of the pk-pk value nor deriving an average value will be useful in estimating the actual pk-pk level of the transmitted optical signal for the purposes of controlling the operating conditions.

FIG. 5 shows simulations of how the probability density function (PDF) of such an NRZ data signal is affected by the bandwidth of a channel through which is passes. The symbol rate has been set at 10 Gb/s with a run length of 30 symbols. The PDF is obtained by quantising the channel output into 32 equal bins, whose scale is normalised with respect to the pk-pk value of the ideal un-filtered signal. In these example simulations the channel bandwidths are set at 2 GHz, 1 GHz, 500 MHz, 200 MHz and 100 MHz. The PDFs obtained for each bandwidth are shown with the highest channel bandwidth at the top of the plot. With the highest bandwidth of 2 GHz, from the PDF 501 it can be seen that there is significant output at or near the ideal peak values in the bins at each end of the horizontal scale, and less output in the central bins as would be expected from a signal that spent most time at the stable 1 or 0 values. As the monitor channel bandwidth is reduced to 1 GHz there is still significant output in the bins at the extremes of the normalised PDF range 502, which correspond to the ideal optical signal peak values, but there is more in the central bins. Reducing the bandwidth to 500 MHz results in a PDF 503 where there is only a small output in the peak value bins, and the central bins begin to have the largest output. With a bandwidth of 200 MHz the PDF 504 has a Gaussian appearance, with minimal output at the extremes of the normalised PDF range, which would correspond to the ideal peak values. As the bandwidth is reduced still further to 100 MHz, there is little output away from the central bins and the form of the PDF 505 has a stronger Gaussian appearance FIGS. 6A and 6B show comparisons between the PDF of simulated signals and an ideal Gaussian functions. The upper plot 601 shows the case for a 10 Gb/s NRZ signal as described above passed through a monitor channel bandwidth of 680 MHz, representing 6.8% of the symbol rate. The run length has little influence on the strong correspondence with the ideal Gaussian function. Further, the run length also has little influence on the outputs at the extremities of the PDF, which is very low. The lower plot 602 shows the comparisons with a monitor channel bandwidth of 220 MHz or 2.2% of the symbol rate. In this case the correspondence with an ideal Gaussian function is very close, and no significant changes are seen with variations in run length. With this quite low relative bandwidth, there is almost no output visible at the extremes of the normalised PDF range. Note that this type behaviour is well documented, for example by Wonham and Fuller (Journal of Electronics and Control, Vol 4 1958, Issue 6). This behaviour is also used in the context of instrumentation and testing, where a pseudo-random binary sequence may be used to create a continuous analogue signal which approximates closely to band-limited Gaussian white noise. An example of such a test system is reported by Feth (Behavioural Research Methods and Instrumentation, 1970, Vol. 2(4)).

It will be apparent from the foregoing discussion that the output from a monitor channel having a restricted bandwidth has a mean value related to the average optical level, as is known in prior art. It is also apparent that the observed PDF of said monitor channel output has a Gaussian form and further that the standard deviation of same is linked directly to the pk-pk range of the optical signal being monitored and the bandwidth of the monitor channel. Hence if the bandwidth of this monitor channel is known, the mean and standard deviation of the observed PDF are directly linked to the average and pk-pk optical output to be controlled.

It is an aim of some embodiments to be able to control the average and ER of the transmitted optical signal where the monitor signal available via a monitor channel whose bandwidth is significantly less than the symbol rate of the transmitted signal. We may therefor use the abovementioned properties and relationships to provide information to a control system intended to control the average and pk-pk optical output (or in other terms, the ER or modulation depth) of the intended system.

Figure 7:
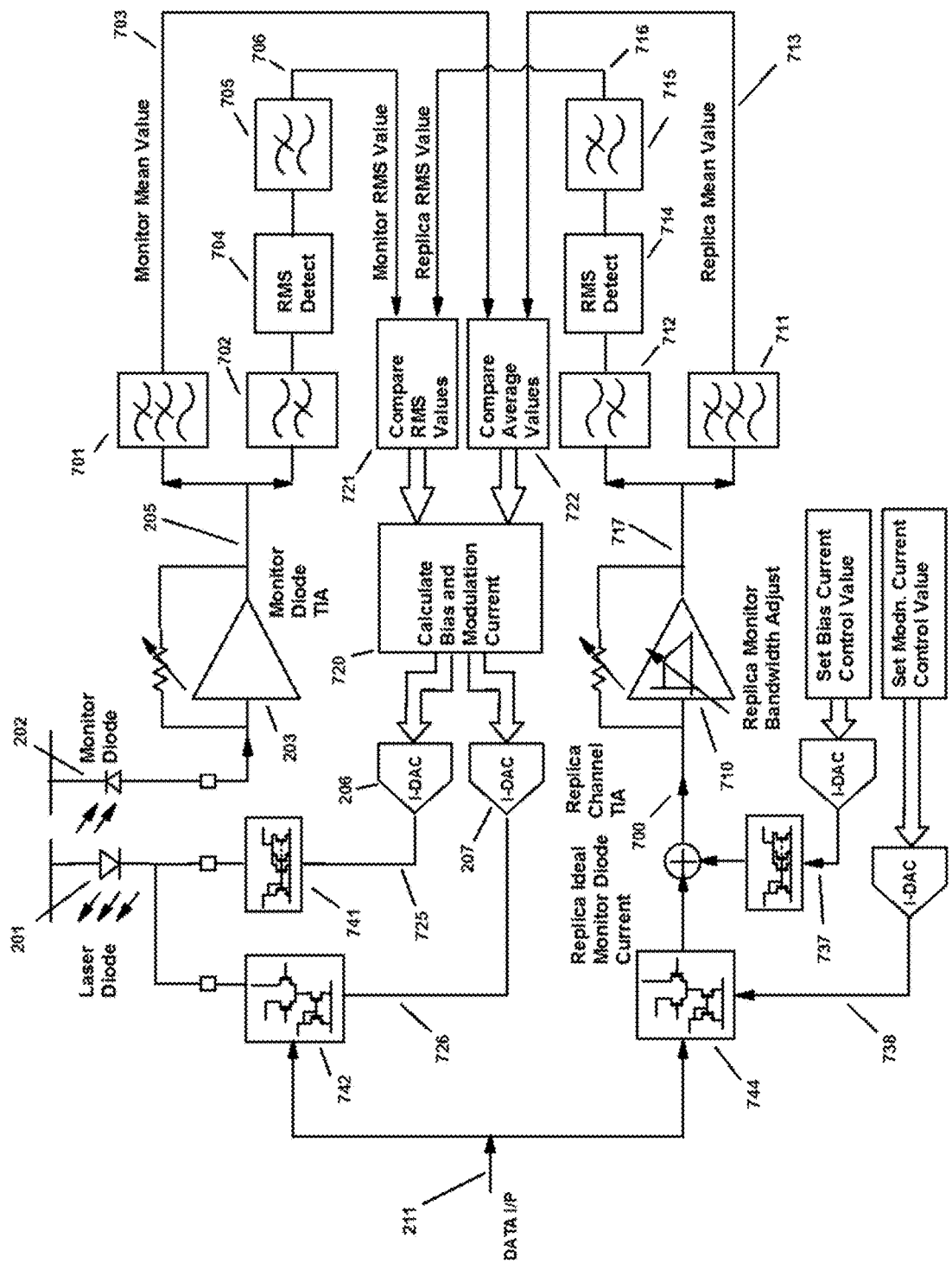
FIG. 7 shows an architecture for an optical transmitter including a replica of the monitor channel with average and root-mean-square (RMS) outputs.

FIG. 7 shows some embodiments according to aspects of the invention employing determination of the mean and standard deviation values of the monitor channel output to provide control of the average and ER of an optical transmit system. In this example, the optical output from the laser 201 is monitored by means of a photodiode 202, whose current is converted to a voltage by means of a trans-impedance amplifier (TIA) 203. For reasons of cost and power, the bandwidth of the combination of this amplifier and the photodiode will typically be much less than the symbol rate of the transmitted optical signal. Hence the output 205 of the monitor TIA 203 will have a PDF that is substantially Gaussian when the transmit data has a typical information payload. The output 205 of said TIA 203 is passed to a low pass filter 701 to provide a signal 703 that represents an estimate of the mean value of the optical output of the laser. This mean value may then be used to control the optical intensity of the transmit laser, by adjusting the bias 725 and modulation 726 currents that supply said laser. The output of this TIA is also passed to a high pass filter 702 to remove the DC content and then passed to a circuit 704 which gives an output signal proportional to the RMS value, which will be the same as the standard deviation. A low pass filter 705 smooths this RMS signal 706 which is then used to provide inputs for a controller function 720 to adjust the bias 725 and modulation 726 currents such that the ER is set to the desired value.

In order for the abovementioned feedback paths to be able to set the average and ER values to the requirements of the system user, some reference values may be either explicitly or implicitly included in the feedback loops. In FIG. 7 the mean reference value 713 and the RMS reference value 716 are provided by means of a replica signal channel. The input to this replica channel is a current 700 representing the ideal current that would be created by a photodiode with a frequency response bandwidth equal to or greater than the symbol rate. The incoming data stream 211 is applied to a replica modulator circuit 744 which either takes its other input in terms of a modulation current 738 which is combined with a bias current 737, or alternatively as an average current and modulation current. The former arrangement is shown in this example. This modulated current 700 is passed to a TIA 710 that is a replica of the monitor photodiode TIA. Further, the gain and bandwidth of this replica amplifier 710 can be configured such that they can be made substantially identical to as those of the monitor channel. In this way, if the current from the replica channel modulator is the same as the current from the monitor photodiode, then the mean and standard deviation of the PDF of the output 717 of the replica TIA will be the same as the output 205 from the monitor channel TIA 203. Hence the replica channel mean and standard deviation can be used as references for the control feedback systems. In the example arrangement in FIG. 7 the output of the replica channel TIA 717 is passed to a low pass filter 711 to provide a replica average value 713. It is also passed to a high pass filter 712 to remove any DC component and then passed to a circuit 714 which gives an output signal proportional to the RMS value which will be the same as the standard deviation. The output from the RMS detection circuitry is then smoothed by a low pass filter 715 to provide a reference RMS or standard deviation signal 716. The mean value signal 703 of the monitor channel and the mean value signal 713 of the replica channel are passed to a comparison function 722 and the resulting error output signal passed to a control function 720. The standard deviation value signal from the monitor channel 706 and the standard deviation from the replica channel 716 are passed to a comparison function 721 and the resulting error output signal passed to a control function 720. Using these error signals, the control function 720 determines the required settings for the transmit laser bias 725 and modulation 726 currents. This control function 720 may be provided by means of analogue to digital conversion, digital computation, and digital to analogue conversion. Alternatively, the error signals may be used to control the transmit modulation and bias currents using substantially analogue circuitry.

In order for the comparison of the monitor and replica channels to be representative of the difference between the desired average output and ER and the actual average and ER of the optical signal it is essential that the gain and bandwidth of the replica TIA matches that of the monitor channel TIA. Thus in order for the proposed system to function with sufficient accuracy, it is necessary to calibrate the bandwidth and gain of the replica channel such that these match those of the monitor channel. The determination of the low frequency gain is relatively straightforward, and a simple DC measurement could be used to get an estimate. In most embodiments it is sufficient to ensure that the TIA circuit and the feedback impedances associated therewith are made identical for the monitor and replica paths.

Figure 8:
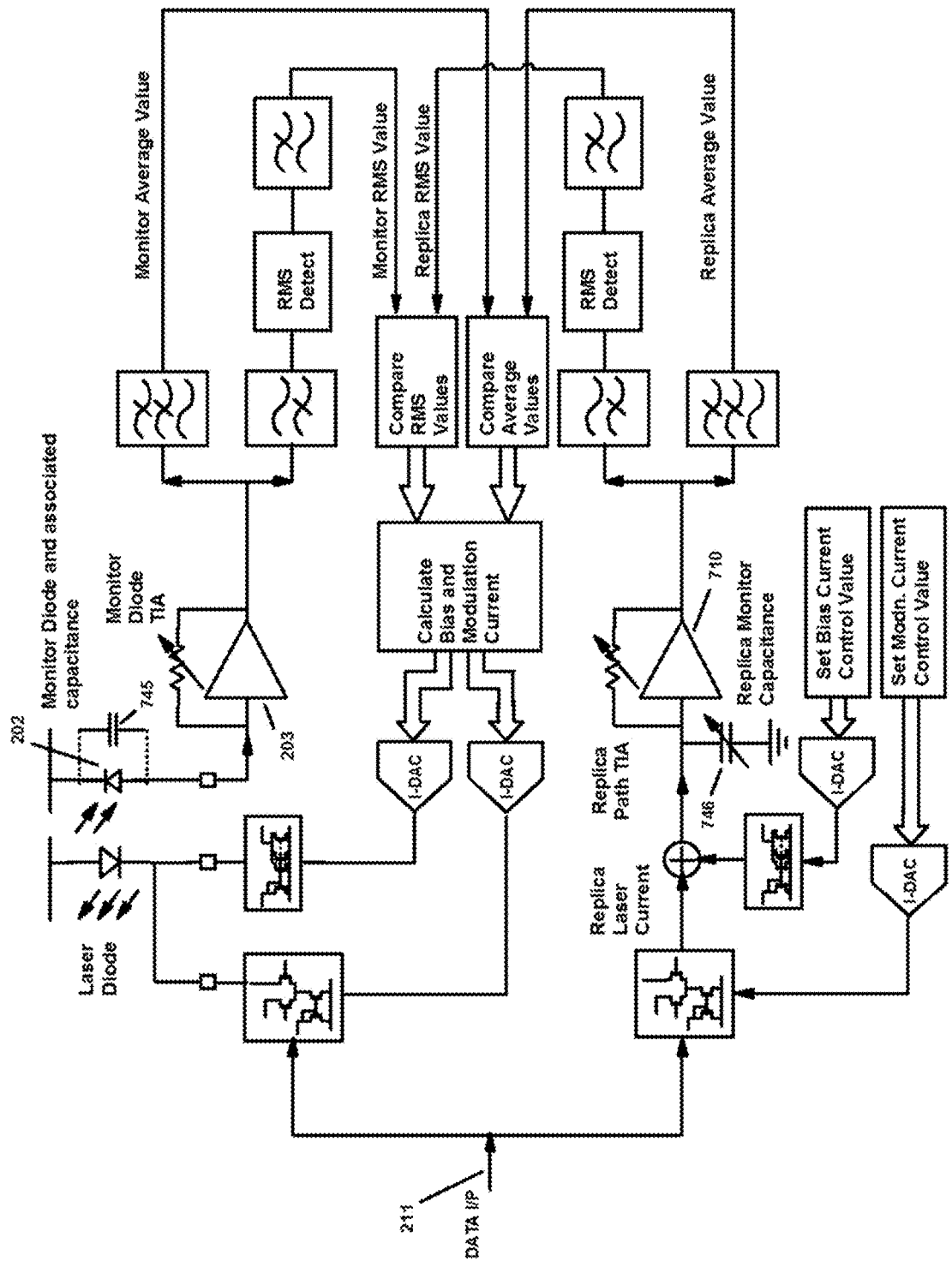
FIG. 8 shows a further architecture for an optical transmitter including a replica of the monitor channel with average and root-mean-square (RMS) outputs.

It is clear that even if the replica 710 and monitor TIA 203 circuits are identical, the bandwidth of the monitor channel will depend on the characteristics of the monitor photodiode 202 used in the particular application, and in particular the capacitances associated with said photodiode. The total capacitance may be comprised of the internal junction capacitance together with packaging and wiring capacitances. FIG. 8 shows such capacitance 745 in an exemplar arrangement. Thus if the monitor and replica TIA circuits are identical, then if a capacitance 746 equal to that of the monitor photodiode etc. is placed at the input of the replica channel TIA, then the bandwidths of these two channels will be substantially identical. To achieve the goal of having the bandwidths of the monitor and the replica channels, it is therefore necessary to determine the value of the capacitance of the photodiode 202 and associated parasitic capacitances as incorporated into the monitor channel.

Figure 9:
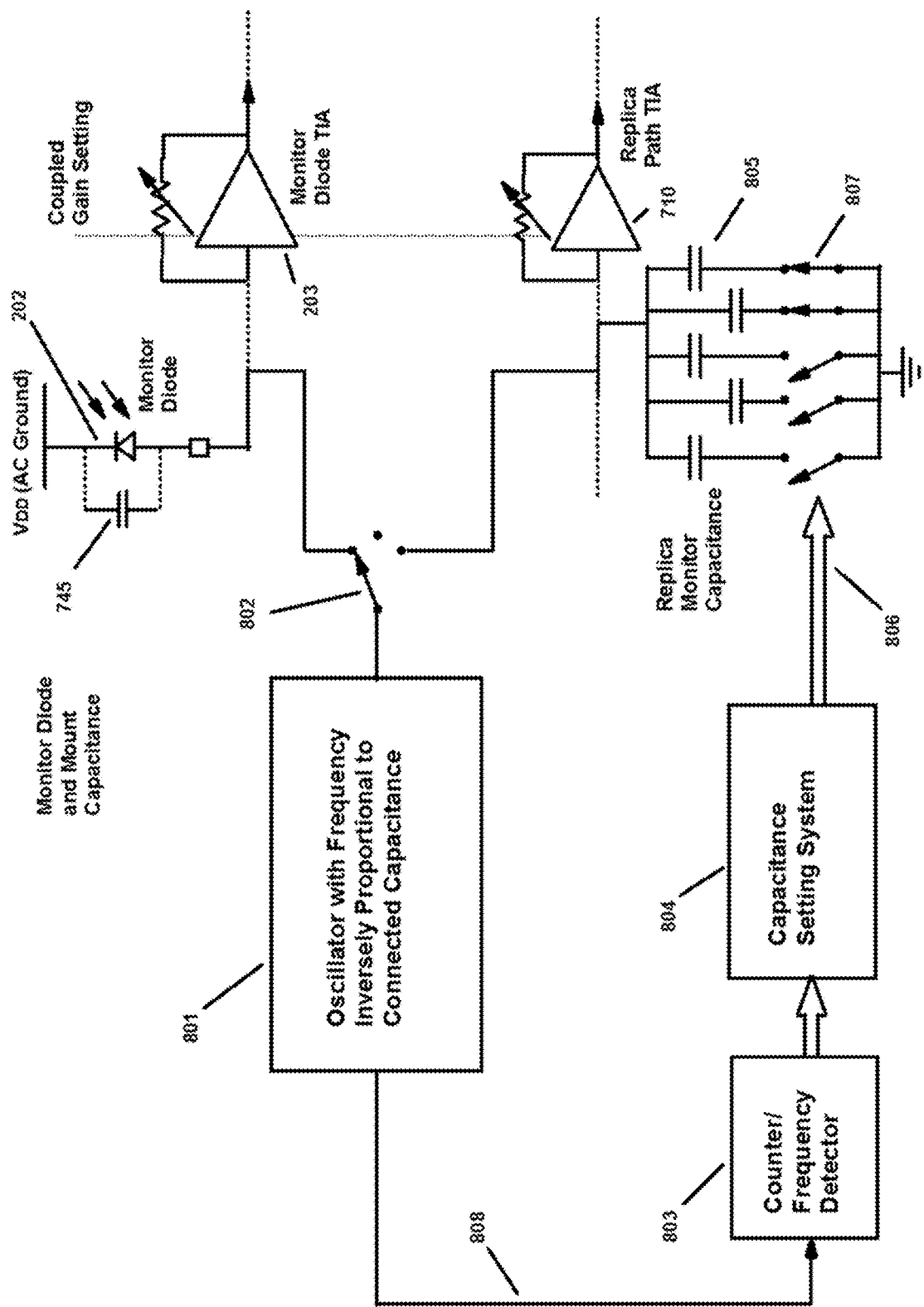
FIG. 9 shows measurement of the capacitance at the monitor channel input due to the monitor photodiode.

FIG. 9 shows an example of some embodiments that have as their aim to make such a determination of the effective capacitance associated with the monitor photodiode and to provide a replica capacitance at the input of the replica channel TIA. An oscillator circuit 801 is provided whose frequency of oscillation is determined by the capacitance connected to a defined circuit node via a selector switch 802. In a first configuration, the photodiode 202 and associated wiring is first connected to said oscillator circuit 801, whereupon the frequency of the output signal 808 from the oscillator will be determined by the capacitance of the photodiode and its associated wiring. This first oscillator output frequency is then measured and stored by some means, for example in a counter/frequency detector function 803. In a second configuration, the photodiode is disconnected from the oscillator circuit 801 and in its place the selector switch 802 connects the oscillator to an array of capacitors 805 of various sizes which may be individually connected or disconnected from the replica channel by switches 807 according to some digital control value 806. The value of the oscillator's output frequency is now determined by the total value of the capacitance on the replica channel input node, and can be varied according to which of the capacitors in the array 805 are connected. The capacitor array switches are set in some defined initial state and the oscillator output signal frequency is measured by the aforementioned means 803, and this frequency is then compared with the frequency observed when the photodiode was connected in the first configuration in a controller function 804 for setting the capacitance array switches. Any difference between the two frequencies is used by the capacitance setting system 804. The capacitors in the array 805 are then connected or disconnected according to some algorithm such that the frequency in this second configuration becomes substantially the same as the frequency observed in the first configuration when the photodiode 202 was connected. The connection of the capacitors in the array may be set initially in any arbitrary state, but it will be apparent that some initial configurations may be more convenient than others for the purpose of expeditiously achieving the optimum setting of the capacitor array selection switches.

It will be apparent that when this convergence of operating frequencies in the first and second configurations is achieved, it can be deduced that the capacitance 745 at the input of the monitor TIA 203 due to the photodiode 202 and the capacitance 805 at the input of the replica TIA 710 due to the capacitor array are substantially identical. It further follows that if the monitor and replica TIA circuits are designed and constructed so as to be substantially identical, then in this condition their operating bandwidths may be taken as substantially identical. In this way the operating conditions are satisfied such that the replica channel output may be used with the monitor channel output to compare their mean and standard deviation values respectively for the purposes of controlling the optical intensity and the ER of the transmitted optical signal.

Figure 10:
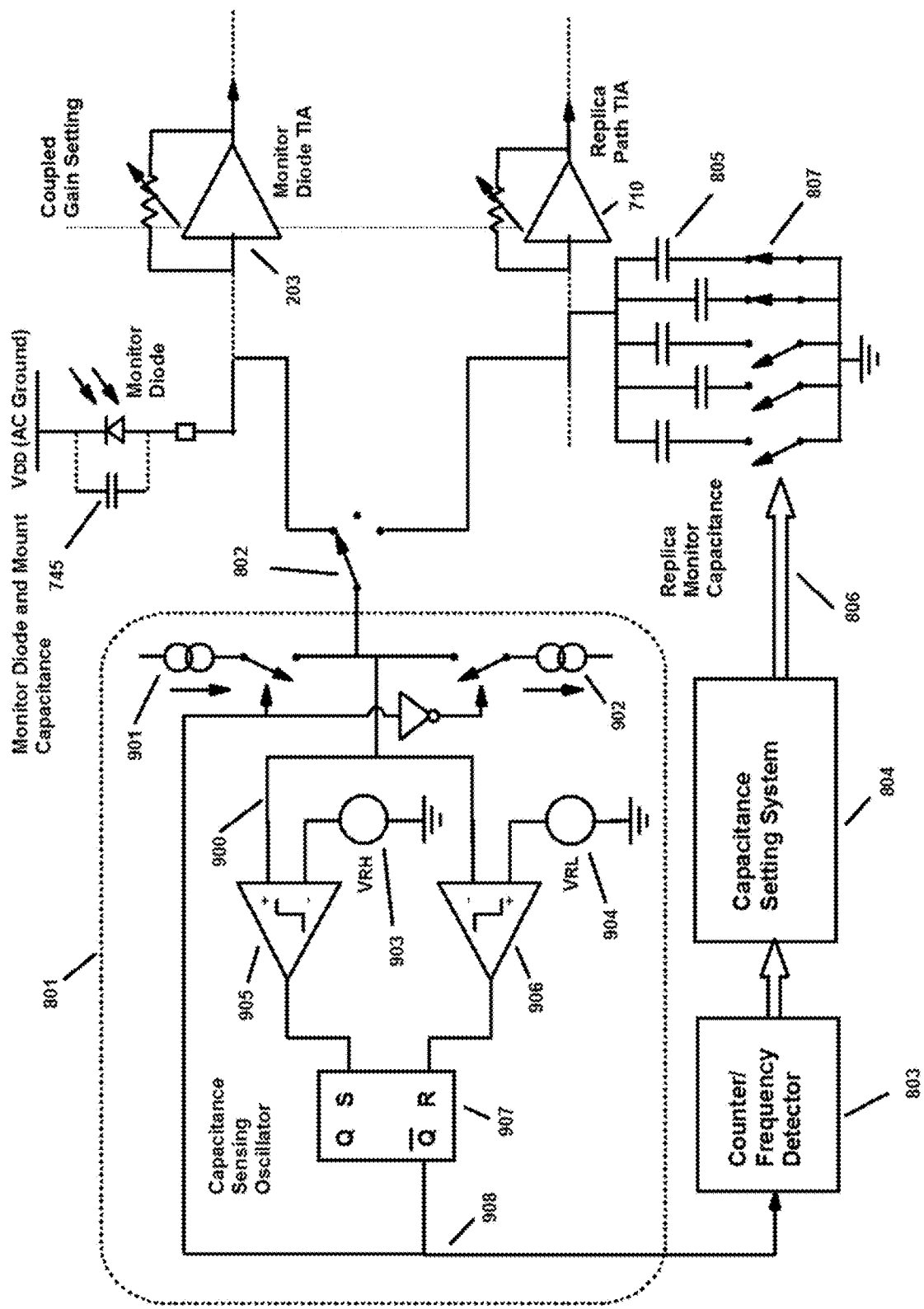
FIG. 10 shows an exemplar capacitance measurement arrangement for the monitor channel.

FIG. 10 show an example of some embodiments of an oscillator circuit that may be used to perform the function of generating test signals whose frequencies are substantially inversely proportional to the capacitance connected to a specified circuit node. A defined charging current 901 is supplied to the capacitance connected to said node, and the voltage on the capacitance 900 rises at a substantially linear rate until it reaches a defined upper threshold voltage 903. When the voltage on the capacitance reaches the threshold this condition is sensed by a comparison function 905 and the event registered as a logical value in some simple sequential logic 907. A resulting logical value 908 is then used to effect the disconnection of the charging current 901 from the connected capacitance and the connection of a defined discharging current 902 so that the voltage 900 on the capacitance now connected falls at a substantially linear rate until it reaches a defined lower threshold voltage 904. On reaching said lower threshold voltage, this is sensed by a comparison function 906 and the abovementioned logical value 908 reset. This change of logical state effects the disconnection of the discharging current 902 and the re-connection of the aforementioned charging current 901. Hence the oscillation frequency is determined by the charging and discharging current, the difference between the upper and lower threshold voltages and the magnitude of the capacitance connected to the oscillator. Thus the frequency of oscillation can be used as a measure of the capacitance of either the photodiode at the TIA input, or the bank of selectable capacitors.

Prior to operating the system with an optical signal it is therefore necessary to perform the capacitance measurement and hence the associated bandwidth calibration and bandwidth matching procedure before the optical intensity and ER control loops can operate as intended. This calibration and matching procedure may be done once as part of a factory testing procedure or it may be done periodically between periods of data transmission when deployed in some application to account for environmental changes and the effects of ageing.

Whilst this invention has been described with reference to particular examples and possible embodiments thereof these should not be interpreted as restricting the scope of the invention in any way. It is to be made clear that many other possible embodiments, modifications and improvements may be incorporated into or with the invention without departing from the scope and spirit of the invention as set out in the claims.

The invention claimed is:

1. A system for controlling an optical intensity and modulation of an optical data transmitter comprising:
   current driver circuitry configured to provide a drive current to a laser diode wherein said current comprises a fixed component and a modulated component, said modulated component having a magnitude related to an input data stream;
   monitor circuitry, comprising a photodiode and a first transimpedance amplifier coupled to said photodiode, said monitor circuitry configured to provide an output signal related to an optical intensity of said laser diode;
   replica monitor circuitry comprising a replica capacitor with a replica capacitance and a second transimpedance amplifier configured to be substantially identical in construction to said first transimpedance amplifier, said second transimpedance amplifier coupled to said replica capacitor; and
   replica capacitance control circuitry configured to control said replica capacitance of said replica capacitor to match a capacitance associated with said photodiode.

2. The system as in claim 1, wherein said replica capacitance control circuitry is configured to control said replica capacitance of said replica capacitor such that a bandwidth of said second transimpedance amplifier is configured to be substantially identical to a bandwidth of said first transimpedance amplifier.

3. The system as in claim 1, wherein said replica capacitance control circuitry comprises:
   an oscillator configured to generate a frequency output signal;
   a switch configured to couple said oscillator to one of said photodiode and said replica capacitor, wherein said oscillator is configured to generate said frequency output signal at a frequency determined by a value of a capacitance coupled to said oscillator by said switch.

4. The system as in claim 3, further comprising frequency determining circuitry for determining a frequency of said frequency output signal.

5. The system as in claim 4, wherein said frequency determining circuitry further comprises a counter configured to determine said frequency of said frequency output signal.

6. The system as in claim 4, further comprising a comparator configured to compare a frequency of said frequency output signal when said switch couples said oscillator to one of said photodiode and said replica capacitor.

7. The system as in claim 4, wherein said replica capacitance control circuitry is configured to receive an output from said frequency determining circuitry and control said capacitance of said replica capacitor.

8. The system as in claim 7, wherein said replica capacitor comprises a plurality of switchable capacitors arranged electrically in parallel, and wherein said replica capacitance control circuitry is configured to control switching of said plurality of switchable capacitors to match said capacitance associated with said photodiode.

9. A method for controlling an optical intensity and modulation of an optical data transmitter, the method comprising:
   providing a drive current to a laser diode wherein said current comprises a fixed component and a modulated component, said modulated component having a magnitude related to an input data stream;
providing an output signal related to an optical intensity of said laser diode using a photodiode and a first transimpedance amplifier coupled to said photodiode;
providing a replica capacitor with a replica capacitance and a second transimpedance amplifier configured to be substantially identical in construction to said first transimpedance amplifier, said second transimpedance amplifier coupled to said replica capacitor; and
controlling said replica capacitance of said replica capacitor to match a capacitance associated with said photodiode.

10. A system for controlling the optical intensity and modulation of an optical data transmitter comprising:
current driver circuitry configured to provide a drive current to a laser diode wherein said current comprises a fixed component and a modulated component, said modulated component having a magnitude related to an input data stream, and;
monitor circuitry, said monitor circuitry comprising:
a photodiode; and
a first transimpedance amplifier coupled to said photodiode, wherein said monitor circuitry is configured to provide an output signal related to an optical intensity of said laser diode;
replica monitor circuitry, said replica monitor circuitry comprising:
a second transimpedance amplifier, said second transimpedance amplifier configured to be substantially identical in construction to said first transimpedance amplifier; and
replica control circuitry configured to control a gain and a bandwidth of said second transimpedance amplifier to be substantially identical to said first transimpedance amplifier;
a current source configured to provide a fixed current and a modulated current to an input of said second transimpedance amplifier, said modulated current having a magnitude related to said input data stream; and
current driver control circuitry configured to determine a mean and a standard deviation of outputs of said first and second transimpedance amplifiers, and generate at least one control signal to control said current driver circuitry to control an average and a modulation depth of the optical intensity of said laser diode based on said mean and said standard deviation of said outputs of said first and second transimpedance amplifiers.

11. The system as in claim 10, wherein said current driver control circuitry comprises:
a first low pass filter coupled to receive an output of said first transimpedance amplifier and configured to generate a first mean output related to said mean of said output of said first transimpedance amplifier.

12. The system as in claim 11, wherein said current driver control circuitry comprises:
a second low pass filter coupled to receive an output of said second transimpedance amplifier and configured to generate a second mean output related to said mean of said output of said second transimpedance amplifier.

13. The system as in claim 10, wherein said current driver control circuitry further comprises:
a first high pass filter coupled to receive said output of said first transimpedance amplifier;
a first root-mean-square (RMS) detector coupled to receive an output of said first high pass filter; and
a first RMS low pass filter coupled to receive an output of said first RMS detector and configured to generate an output related to the standard deviation of said output of said first transimpedance amplifier.

14. The system as in claim 13, wherein said current driver control circuitry further comprises:
a second high pass filter coupled to receive said output of said second transimpedance amplifier;
a second root-mean-square (RMS) detector coupled to receive an output of said second high pass filter; and
a second RMS low pass filter coupled to receive an output of said second RMS detector and configured to generate an output related to the standard deviation of said output of said second transimpedance amplifier.

15. The system as in claim 10, wherein said current driver control circuitry further comprises:
first comparator circuitry configured to compare said mean output of said output of said first transimpedance amplifier with said mean output of said output of said second transimpedance amplifier.

16. The system as in claim 15, wherein said current driver control circuitry further comprises:
second comparator circuitry configured to compare said standard deviation output of said output of said first transimpedance amplifier with said standard deviation output of said output of said second transimpedance amplifier.

17. The system as in claim 16, wherein said current driver control circuitry further comprises a signal generator configured to generate at least one bias and modulation current driver control signal based on said first comparator circuitry and said second comparator circuitry, said at least one bias and modulation current driver control signal configured to control said average optical intensity and to control said modulation depth of said laser diode.

18. The system as in claim 10, wherein said replica control circuitry is configured to control said bandwidth of said second transimpedance amplifier by altering a value of a capacitance connected to said input of said second transimpedance amplifier.

19. The system as in claim 18, further comprising an oscillator circuit configured to generate a frequency output signal, wherein said frequency output signal is used to compare said capacitance connected to said input of said second transimpedance amplifier with a capacitance connected to an input of said first transimpedance amplifier.

20. A method for controlling the optical intensity and modulation of an optical data transmitter, the method comprising:
providing a drive current to a laser diode wherein said current comprises a fixed component and a modulated component, said modulated component having a magnitude related to an input data stream, and;
monitoring using monitor circuitry to provide an output signal related to an optical intensity of said laser diode, said monitor circuitry comprising:
a photodiode; and
a first transimpedance amplifier coupled to said photodiode;
replicating said monitoring circuitry, using replica monitor circuitry, said replica monitor circuitry comprising:
a second transimpedance amplifier, said second transimpedance amplifier configured to be substantially identical in construction to said first transimpedance amplifier; and replica control circuitry configured to control a gain and a bandwidth of said second transimpedance amplifier to be substantially identical to said first transimpedance amplifier;

providing a fixed current and a modulated current to an input of said second transimpedance amplifier using a current source, said modulated current having a magnitude related to said input data stream;

determining a mean and a standard deviation of outputs of the first and second transimpedance amplifiers; and generating at least one control signal to control said current driver circuitry to control an average and modulation depth of the optical intensity of said laser diode based on said mean and said standard deviation of the outputs of said first and second transimpedance amplifiers.

* * * * *